(12) United States Patent
Rudeck et al.

(10) Patent No.: US 6,803,624 B2
(45) Date of Patent: Oct. 12, 2004

(54) PROGRAMMABLE MEMORY DEVICES SUPPORTED BY SEMICONDUCTIVE SUBSTRATES

(75) Inventors: Paul J. Rudeck, Boise, ID (US); Graham Wolstenholme, Boise, ID (US); Robert Carr, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/190,422

(22) Filed: Jul. 3, 2002

(65) Prior Publication Data

US 2004/0004243 A1 Jan. 8, 2004

(51) Int. Cl.[7] .............................................. H01L 29/788
(52) U.S. Cl. ...................................... 257/315; 257/314
(58) Field of Search ................................. 257/314–315

(56) References Cited

U.S. PATENT DOCUMENTS

| | | | |
|---|---|---|---|
| 6,188,115 B1 * | 2/2001 | Kamitani | 257/412 |
| 6,288,419 B1 * | 9/2001 | Prall et al. | 257/213 |
| 6,346,467 B1 | 2/2002 | Chang et al. | |
| 6,383,870 B2 * | 5/2002 | San et al. | 438/257 |
| 6,429,108 B1 | 8/2002 | Chang et al. | |
| 6,630,392 B2 | 10/2003 | Kim et al. | |
| 6,642,112 B1 | 11/2003 | Lowe et al. | |
| 2003/0003657 A1 * | 1/2003 | Kim et al. | 438/257 |

* cited by examiner

Primary Examiner—Allan R. Wilson
(74) Attorney, Agent, or Firm—Wells St. John P.S.

(57) ABSTRACT

The invention includes a memory device supported by a semiconductor substrate and comprising in ascending order from the substrate: a floating gate, a dielectric material, a layer consisting essentially of tungsten nitride, a first mass consisting essentially of tungsten, and a second mass consisting essentially of one or more nitride compounds. The invention includes a memory device having a floating gate and a dielectric material over the floating gate. The device has a mass consisting essentially of tungsten over the dielectric material, with the mass having a pair of opposing sidewalls. A pair of sidewall spacers are along the opposing sidewalls of the mass. The sidewall spacers comprise a first layer consisting essentially of one or more nitride compounds and a second layer different from the first layer. The invention includes methods of making memory devices.

114 Claims, 9 Drawing Sheets

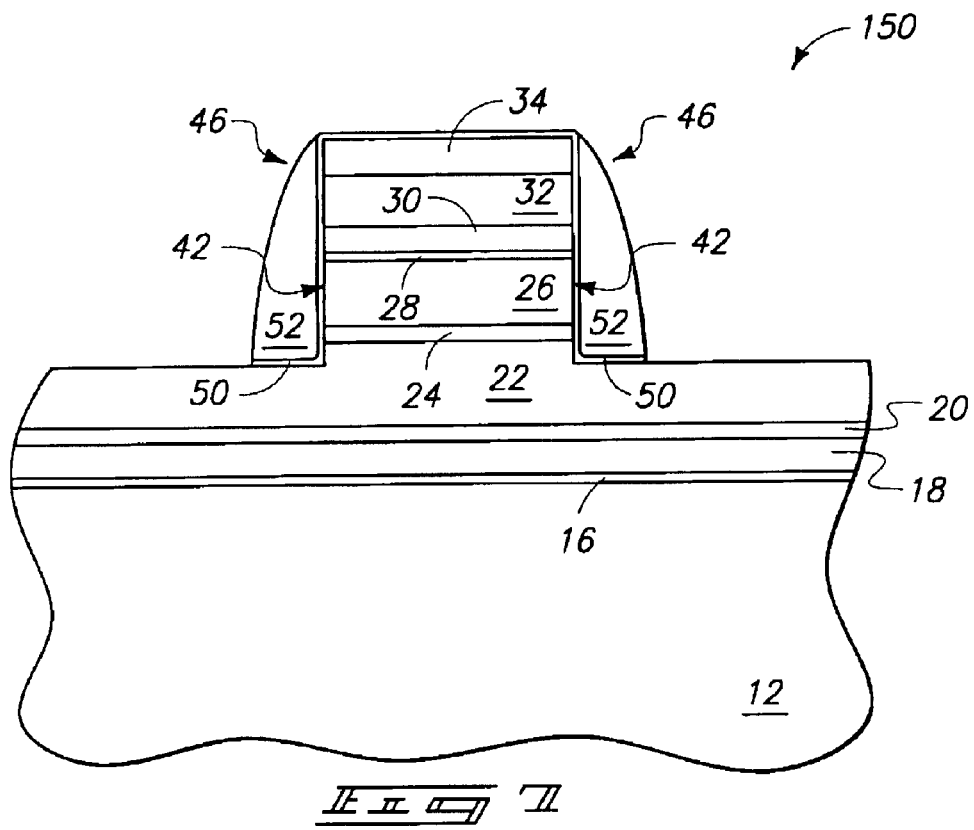
F I G. 7
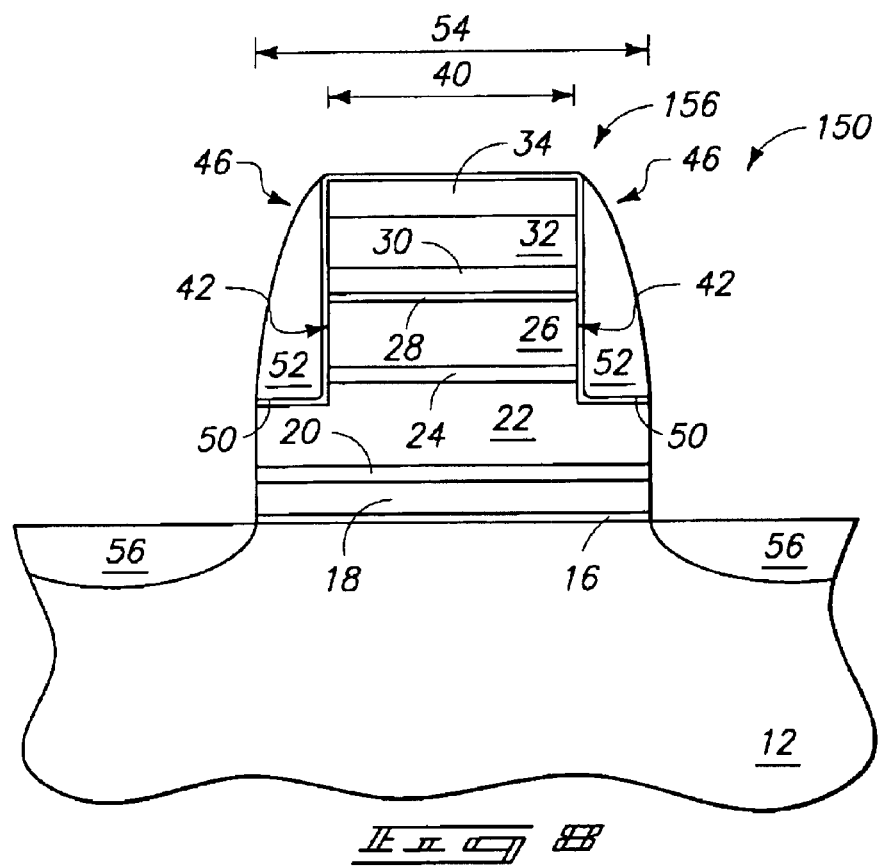
F I G. 8

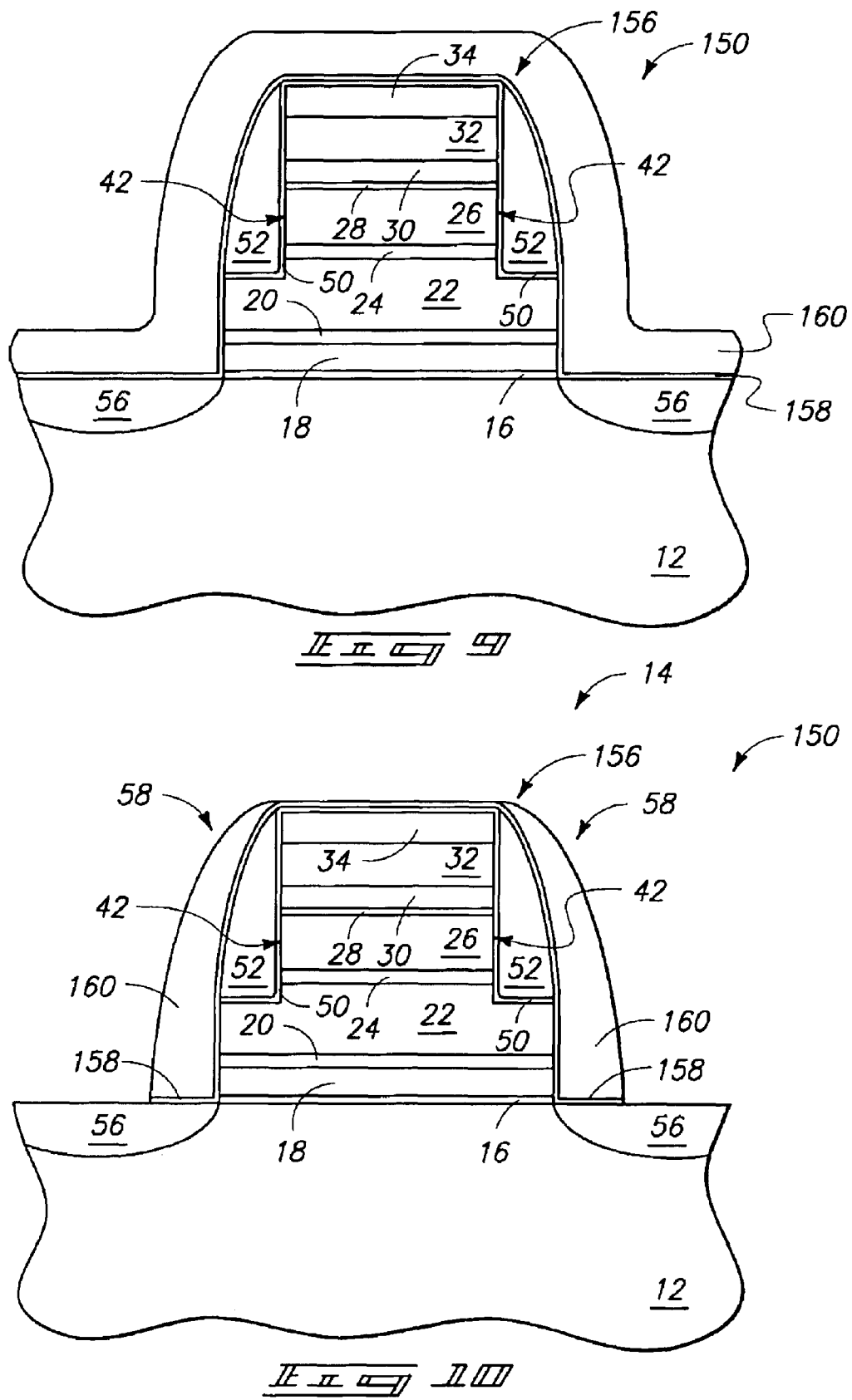

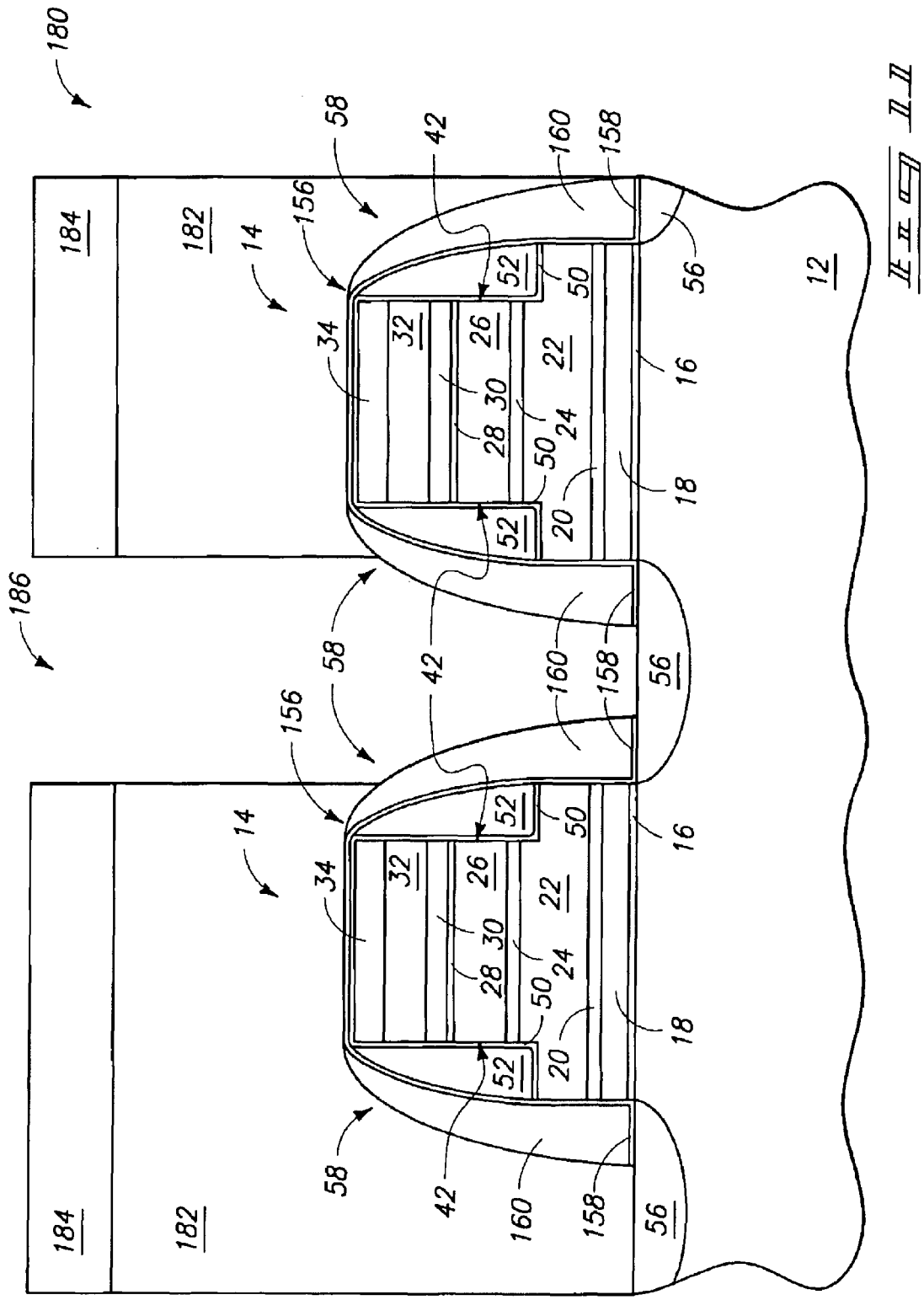

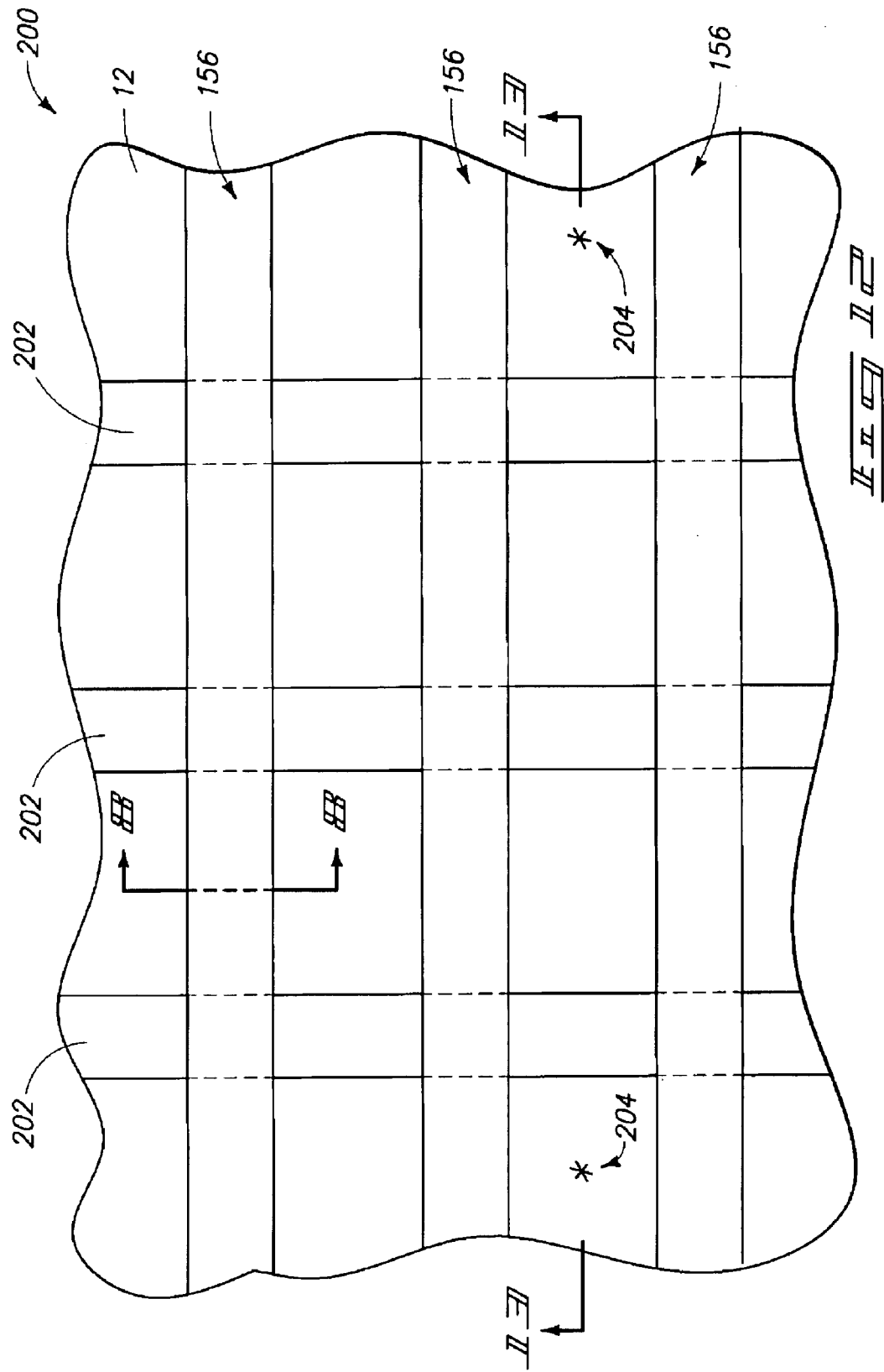

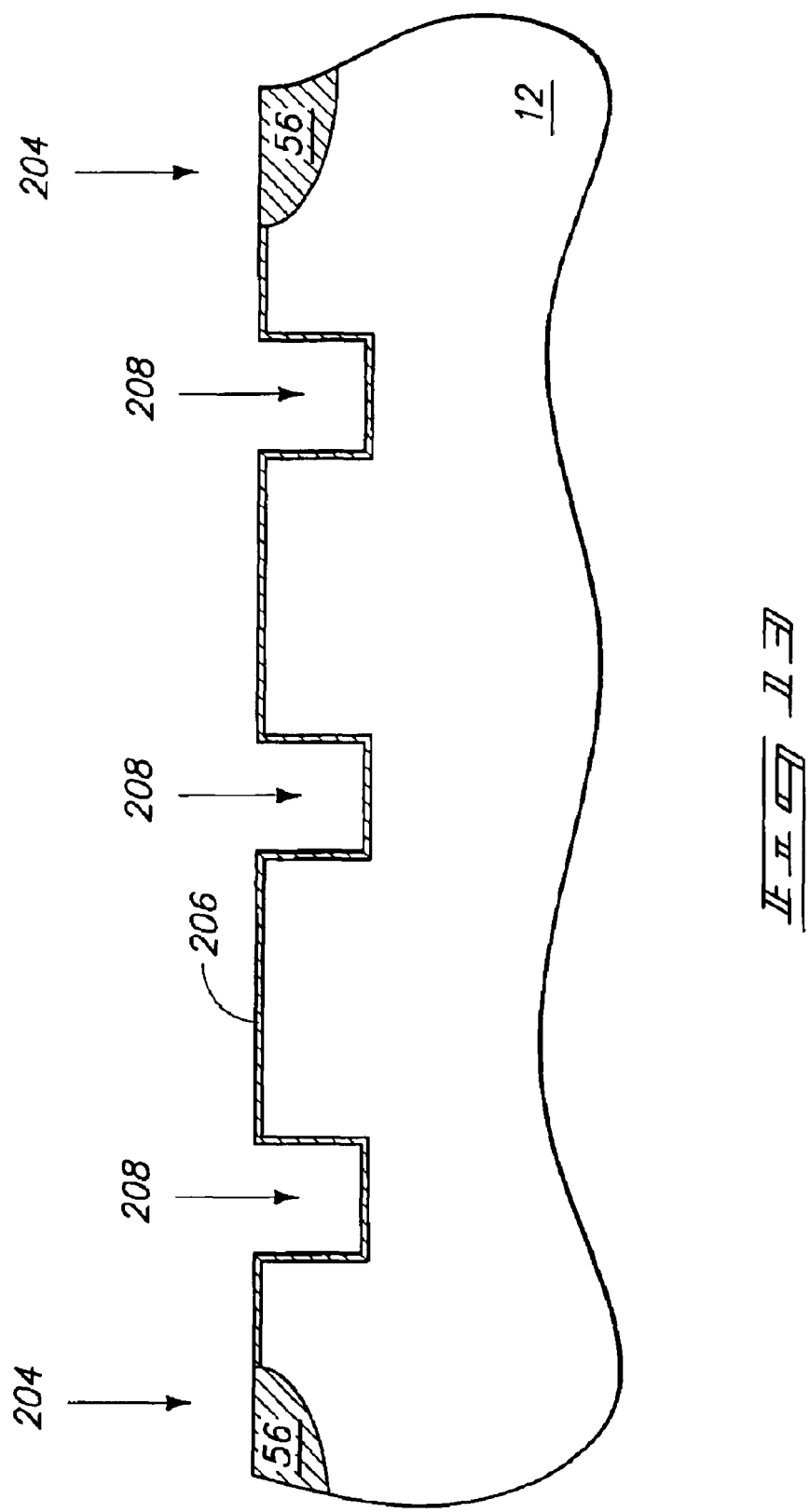

PROGRAMMABLE MEMORY DEVICES SUPPORTED BY SEMICONDUCTIVE SUBSTRATES

TECHNICAL FIELD

The invention pertains to programmable memory devices, such as, for example, erasable programmable read-only memory (EPROM) devices, electrically erasable programmable read-only (EEPROM) devices, and flash memory devices. The invention also pertains to methods of forming programmable memory devices.

BACKGROUND OF THE INVENTION

Programmable memory devices have numerous applications in modern semiconductor structures. Among the devices which can be particularly useful are EPROM and EEPROM devices, which can store information in read-only format and yet enable the information stored therein to be erased by subjecting the memory devices to appropriate energy. The energy utilized to erase EPROM devices is typically ultraviolet (UV) radiation, whereas the energy utilized to erase EEPROM devices is electrical energy. A flash device is typically an EEPROM device, with the term "flash" indicating that the device can be erased within a time of less than or equal to 2 seconds.

It is desired to develop improved methods for forming programmable read-only memory devices.

SUMMARY OF THE INVENTION

In various aspects, this disclosure describes methods which can allow pure tungsten to be utilized to lower resistance of a wordline while at the same time offering protection from cross-contamination during oxidation steps. The strapping of a wordline with pure tungsten metal can permit reduction of both the overall thickness of a gate stack, and the overall resistance of the wordline. A problem that frequently occurs when pure tungsten metal is utilized in a non-volatile memory (such as flash memory) is that cross-contamination, created during various oxidation steps associated with device fabrication, can degrade the long term data retention properties of the memory cell. This disclosure describes various methods which can be used to encapsulate tungsten during the oxidation steps, while also providing desired stability during a "source rail etch" that can occur prior to one or more of the various oxidation steps.

In one aspect, the invention includes a memory device supported by a semiconductor substrate and comprising in ascending order from the substrate a floating gate, a dielectric material, a layer consisting essentially of tungsten nitride, a first mass consisting essentially of tungsten, and a second mass consisting essentially of one or more nitride compounds.

In one aspect, the invention encompasses a memory device having a floating gate and a dielectric material over the floating gate. The device also includes a mass consisting essentially of tungsten over the dielectric material, with the mass having a pair of opposing sidewalls. A pair of sidewall spacers are along the opposing sidewalls of the mass. The sidewall spacers comprise a first layer consisting essentially of one or more nitride compounds and a second layer different from the first layer.

In one aspect, the invention encompasses a method of making a programmable memory device. A floating gate mass is formed over a semiconductor substrate, and a dielectric material is formed over the floating gate mass. A first layer consisting essentially of tungsten is formed over the dielectric material, and a second layer consisting essentially of one or more nitride compounds is formed over the layer consisting essentially of tungsten. A first gate pattern is formed by etching through the first and second layers. The first gate pattern has sidewalls extending along the etched layers. Sidewall spacers are formed along the sidewalls. While the sidewall spacers are along the sidewalls, a second gate pattern is formed by etching through the dielectric material and the floating gate mass. The first and second gate patterns together are incorporated into a programmable memory device.

BRIEF DESCRIPTION OF THE DRAWINGS

Preferred embodiments of the invention are described below with reference to the following accompanying drawings.

FIG. 7 is a view of the FIG. 4 wafer fragment shown at a processing stage subsequent to that of FIG. 6.

FIG. 8 is a view of the FIG. 4 wafer fragment shown at a processing stage subsequent to that of FIG. 7.

FIG. 9 is a view of the FIG. 4 wafer fragment shown at a processing stage subsequent to that of FIG. 8.

FIG. 10 is a view of the FIG. 4 wafer fragment shown at a processing stage subsequent to that of FIG. 9. The FIG. 10 structure is similar to the structure described previously with reference to FIG. 1.

FIG. 11 is a view of a semiconductor wafer fragment comprising two programmable memory devices utilized in a self-aligned contact etch.

FIG. 12 is a diagrammatic top view of a semiconductor fragment illustrating a preliminary stage in the fabrication of a source rail.

FIG. 13 is a diagrammatic, cross-sectional view of a region of the FIG. 12 fragment shown along the line 13—13, and illustrated at a processing stage subsequent to that of FIG. 12 in the fabrication of the source rail.

DETAILED DESCRIPTION OF THE PREFERRED EMBODIMENTS

Figure 1:
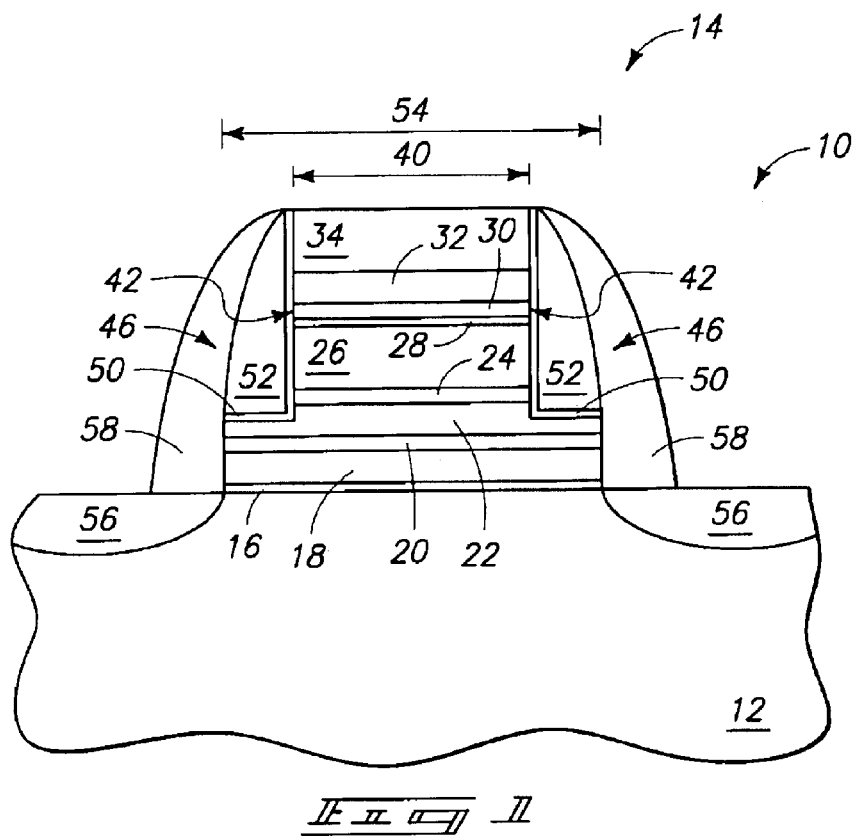
FIG. 1 is a diagrammatic, cross-sectional view of a semiconductor fragment illustrating an exemplary programmable memory device of the present invention.

The invention encompasses various new configurations of programmable memory devices. Such programmable devices can be, for example, EPROM devices, EEPROM devices, and flash devices. An exemplary device formed in accordance with an aspect of the present invention is diagrammatically illustrated with reference to a fragment 10 in FIG. 1. Fragment 10 comprises a semiconductor substrate 12. Substrate 12 can comprise, for example, monocrystalline silicon lightly-doped with a suitable dopant material. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A programmable memory gate structure 14 is supported by substrate 12. Gate structure 14 comprises a layer 16 having a floating gate 18 thereover. Layer 16 can comprise, consist essentially of, or consist of silicon dioxide, and can be referred to as a gate oxide layer. Floating gate 18 can comprise, consist essentially of, or consist of conductively-doped silicon (such as, for example, polycrystalline silicon and/or amorphous silicon). Alternatively, or additionally, floating gate 18 can comprise other conductive materials, such as, for example, various compositions and alloys containing metallic elements.

A dielectric material 20 is over floating gate 18. Dielectric material 20 can comprise a single homogenous composition, or layers of different compositions. In particular aspects, dielectric material 20 includes a layer of silicon nitride between a pair of layers of silicon dioxide.

A silicon-containing layer 22 is over dielectric material 20, and in the shown aspect of the invention is physically against dielectric material 20. Silicon-containing layer 22 can be conductively-doped with conductivity-enhancing dopant, or can be undoped and accordingly electrically insulative. The silicon of layer 22 can be polycrystalline and/or amorphous. In particular aspects, layer 22 can comprise, consist essentially of, or consist of silicon.

A layer 24 comprising tungsten nitride is over, and in the shown embodiment in physical contact with, layer 22. Layer 24 can consist essentially of, or consist of tungsten nitride ($WN_x$).

A layer 26 comprising tungsten is over, and in the shown embodiment physically against, layer 24. Layer 26 can consist essentially of, or consist of tungsten (W). Layer 26 can be referred to as a tungsten-containing mass.

A layer 28 is over, and in the shown embodiment physically against, layer 26. Layer 28 can comprise, consist essentially of, or consist of one or more nitride compounds. In particular aspects, layer 28 consists essentially of, or consists of, tungsten nitride and/or silicon nitride.

In various aspects of this discussion, and in the claims that follow, tungsten-containing material 26 and nitride-containing material 28 can be referred to as masses. For instance, material 26 can be referred to as a first mass and material 28 can be referred to as a second mass.

A silicon-containing layer 30 is formed over mass 28. In particular aspects, layer 30 can comprise, consist essentially of, or consist of silicon. The silicon can be polycrystalline and/or amorphous. Further, the silicon can be either conductively-doped to form an electrically-conductive material, or can be undoped and accordingly be electrically insulative.

A deposited antireflective coating (DARC) 32 is formed over layer 30. Layer 32 can, for example, comprise, consist essentially of, or consist of silicon oxynitride.

An insulative material cap 34 is formed over layer 32. Cap 34 can, for example, comprise, consist essentially of, or consist of one or both of silicon dioxide and silicon nitride. In particular aspects, cap 34 can comprise silicon dioxide deposited from tetraethyl-orthosilicate (or equivalently, tetraethoxy-silane).

Layers 16, 18, 20, 22, 24, 26, 28, 30, 32 and 34 extend in ascending order from substrate 12. The layers together form a gate construction of a programmable memory device. Specifically, layer 18 is a floating gate of the device, and layer 26 is at least a portion of a control gate of the device. It is noted that one or more of layers 22, 24, 28 and 30 can be electrically conductive, and accordingly can also be considered to be part of the control gate.

The relative thicknesses of layers 16, 18, 20, 22, 24, 26, 28, 30, 32 and 34 can vary depending on the application. Exemplary thicknesses of the layers are as follows: layer 16 can be about 85 angstroms thick, layer 18 can be about 250 angstroms thick, material 20 can be about 150 angstroms thick, layer 22 can be about 500 angstroms thick, layer 24 can be about 100 angstroms thick, layer 26 can be about 600 angstroms thick, layer 28 can be about 100 angstroms thick, layer 30 can be about 150 angstroms thick, layer 32 can be about 250 angstroms thick, and layer 34 can be about 750 angstroms thick.

Layers 24, 26, 28, 30, 32 and 34 have a common lateral width 40, and can be considered to comprise a stack having a pair of opposing sidewalls 42. Width 40 can be considered a first lateral width in the discussion that follows.

A pair of sidewall spacers 46 are formed along the opposing sidewalls 42. Spacers 46 comprise a first layer 50 and a second layer 52. First layer 50 can comprise, consist essentially of, or consist of one or more nitride compounds, and second layer 52 has a different composition from the first layer. In particular aspects, second layer 52 can comprise, consist essentially of, or consist of silicon. The silicon is typically substantially undoped, and accordingly electrically insulative. The silicon can be polycrystalline and/or amorphous. In other aspects, second layer 52 can comprise, consist essentially of, or consist of silicon dioxide.

First layer 50 can, for example, comprise, consist essentially of, or consist of tungsten nitride or silicon nitride. In the shown aspect of the invention, first layer 50 is physically against the lateral sides of layers 24, 26, 28, 30, 32 and 34; and layer 52 is physically against layer 50. Further, layer 52 is separated from layers 24, 26, 28, 30, 32 and 34 by layer 50.

A second lateral width 54 can be defined as a sum of the first lateral width 40 plus the lateral widths of spacers 46. Gate oxide 16, floating gate 18, and dielectric material 20 have lateral widths equal to, or about equal to, second lateral width 54.

Silicon-containing layer 22 has a portion proximate dielectric material 20 (a lower portion of the layer 22) having the second lateral width 54; and a portion proximate layer 24 (an upper portion of layer 22) having a lateral width equal to, or about equal to, the first lateral width 40.

A pair of source/drain regions 56 are within substrate 12 as part of the programmable memory device 14.

A pair of outer sidewall spacers 58 are over spacers 46, source/drain regions 56, and lateral peripheries of layers 16, 18, 20 and 22. Sidewall spacers 58 physically contact spacers 46 in the shown embodiment. Sidewall spacers 58 can comprise, consist essentially of, or consist of, for example, one or both of silicon nitride and silicon dioxide. In various aspects, adjacent sidewall spacers 46 and 58 can be together considered to comprise a single sidewall spacer configuration. In other words, the single sidewall spacer configuration can be considered to comprise the various materials of adjacent sidewall spacers 58 and 46, and accordingly have a shape corresponding to the combined shapes of adjacent spacers 58 and 46.

The construction of FIG. 1 can alleviate, and even prevent, problems associated with prior art programmable memory constructions. Specifically, there has recently been a transition to utilization of pure tungsten in control gate constructions (such as, for example, utilization of pure tungsten for mass 26 of the FIG. 1 structure), in place of tungsten silicide. Pure tungsten can reduce the wordline resistance relative to tungsten silicide, while at the same time reducing the height of a gate stack. A problem which arises when utilizing pure tungsten is that data retention of devices incorporating tungsten can be poor. When a tungsten gate cell has been subjected to thermal processing (for example, a sidewall oxidation), it is common for long term data retention to degrade. Possible mechanisms for the adverse effect on data retention are that materials diffuse out of a tungsten material, and/or impurities diffuse into the material, as the tungsten material and adjacent regions are subjected to thermal processing. Accordingly, one aspect of the present invention can be a recognition that elemental tungsten utilized in programmable memory structures should be entirely encapsulated by barrier materials. It is noted that the above-described problems do not occur with tungsten-containing compounds (such as, for example, tungsten nitride or tungsten silicide), but instead appear to be limited to materials comprising relatively pure tungsten. The construction 14 of FIG. 1 has tungsten-containing mass 26 entirely encapsulated by nitride-containing barrier materials. Specifically, materials 50, 24 and 28 comprise, consist essentially of, or consist of various nitride compositions (such as, for example, silicon nitride or tungsten nitride), and can be suitable barriers to prevent diffusion of materials from or to a tungsten-containing mass during thermal processing.

Figure 2:
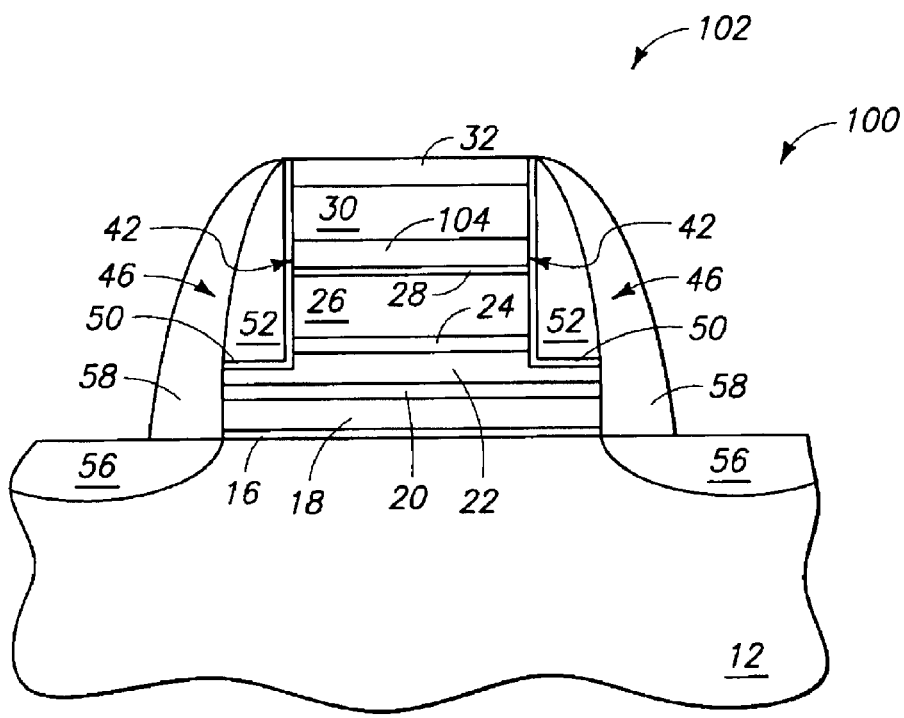
FIG. 2 is a diagrammatic, cross-sectional view of a semiconductor fragment illustrating another exemplary programmable memory device of the present invention.
Figure 3:
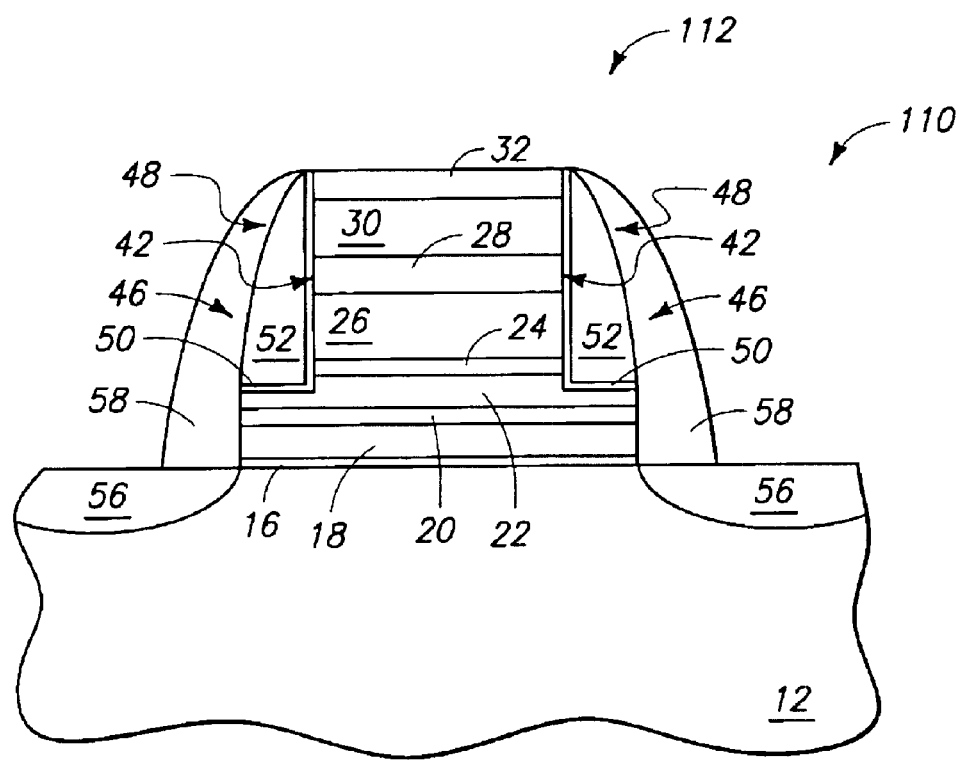
FIG. 3 is a diagrammatic, cross-sectional view of a semiconductor fragment illustrating yet another exemplary programmable memory device of the present invention.

The construction of FIG. 1 illustrates an exemplary construction in which the tungsten-containing mass 26 of a programmable memory device is entirely encapsulated by barrier materials. FIGS. 2 and 3 illustrate other exemplary constructions in which a tungsten-containing mass is encapsulated by barrier materials. In referring to FIGS. 2 and 3, similar numbering will be used as was utilized above in describing FIG. 1, when appropriate.

Referring initially to FIG. 2, a fragment 100 comprises a programmable memory device 102 which is identical to the device 14 of FIG. 1 in all aspects except that insulative cap 34 has been eliminated; a layer 104 has been provided between nitride-containing layer 28 and silicon-containing layer 30; and silicon-containing layer 30 has been thickened. Layer 30 of the FIG. 2 embodiment can have a thickness of about 750 angstroms. Layer 104 can comprise a nitride, but comprises a different composition than layer 28. In particular applications, one of layers 28 and 104 can comprise, consist essentially of, or consist of tungsten nitride; and the other can comprise, consist essentially of, or consist of silicon nitride. In an exemplary application, layer 28 consists essentially of, or consists of tungsten nitride; and layer 104 consists essentially of, or consists of silicon nitride. It is noted that layers 28 and 104 can together be referred to as a nitride-containing mass. In particular aspects, layer 26 can be referred to as a first mass, and layers 28 and 104 can together be referred to as a second mass.

Layer 104 has lateral sidewalls which are co-extensive with the lateral sidewalls of layers 28 and 30. The first portion 50 of spacers 46 is physically against the lateral sidewalls of layer 104 in the shown embodiment.

Referring to FIG. 3, a fragment 110 is illustrated comprising a programmable memory device construction 112. Construction 112 is similar to the construction of 14 of FIG. 1, except that insulative material 34 has been eliminated, and layers 28 and 30 are thicker in the device of FIG. 3 than in the device of FIG. 1. Specifically, layers 28 and 30 in the device of FIG. 3 can have thicknesses of 850 angstroms and 750 angstroms, respectively. In particular applications, the layer 28 of the FIG. 3 construction comprises, consists essentially of, or consists of silicon nitride, and the first composition 50 of spacers 46 also comprises, consists essentially of, or consists of silicon nitride.

An example method for forming the device of FIG. 1 is described with reference to FIGS. 4–10. It is noted that such method can be readily adapted for fabrication of the devices of FIGS. 2 and 3. In referring to FIGS. 4–10, similar numbering will be utilized as was used above in describing FIG. 1, where appropriate.

Figure 4:
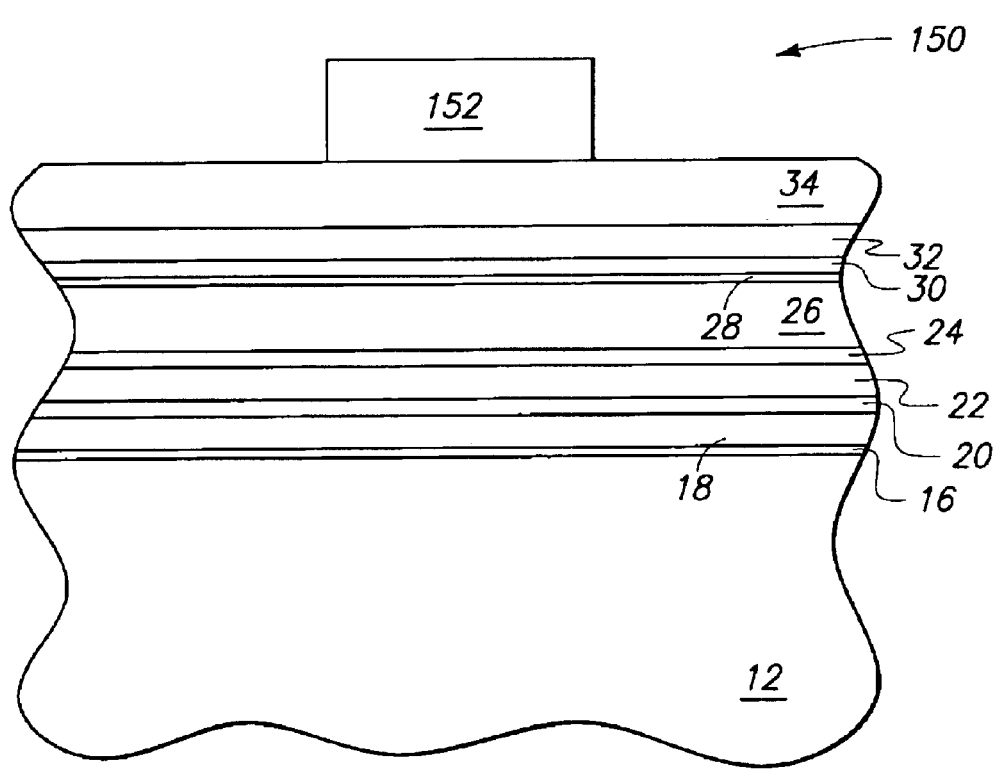
FIG. 4 is a diagrammatic, cross-sectional view of a semiconductor wafer fragment at a preliminary processing stage of an example method of the present invention.

Referring initially to FIG. 4, a construction 150 is illustrated at a preliminary stage of the example method. Construction 150 comprises the substrate 12 described above with reference to FIG. 1. Gate oxide layer 16 is formed over substrate 12, and at least one floating gate layer 18 is formed over gate oxide layer 16. A dielectric material 20 is formed over the at least one floating gate layer, and a silicon-containing material 22 is formed over the dielectric material. A nitride-containing material 24 is formed over silicon-containing material 22. Nitride-containing material 24 can, in particular aspects, consist essentially of, or consist of tungsten nitride.

A mass 26 is formed over layer 24. Mass 26 can, in particular aspects, consist essentially of, or consist of tungsten.

A nitride-containing composition 28 is formed over mass 26. In particular aspects, composition 28 can comprise, consist essentially of, or consist of one or both of tungsten nitride and silicon nitride. The single shown mass 28 can be considered to comprise two separate masses in applications in which a construction comparable to that of FIG. 2 is to be formed (the two separate masses are labeled 28 and 104 in FIG. 2).

A silicon-containing layer 30 is formed over layer 28. In particular aspects, layer 30 comprises a non-oxidized form of silicon, such as, for example, polycrystalline silicon and/or amorphous silicon.

A layer 32 comprising DARC is formed over layer 30. In particular aspects, layer 32 comprises, consists essentially of, or consists of silicon oxynitride.

An electrically insulative material 34 is formed over layer 32. Material 34 can comprise, for example, one or both of silicon dioxide and silicon nitride. In particular aspects, layer 34 consists, or consists essentially of either silicon dioxide or silicon nitride. Mass 34 can be eliminated in applications in which constructions comparable to those of either FIG. 2 or 3 are desired to be formed.

A patterned mask 152 is formed over layer 34. Mask 152 can comprise, for example, photoresist and can be patterned utilizing photolithographic processing. Mask 152 defines a shape of a first gate pattern.

Figure 5:
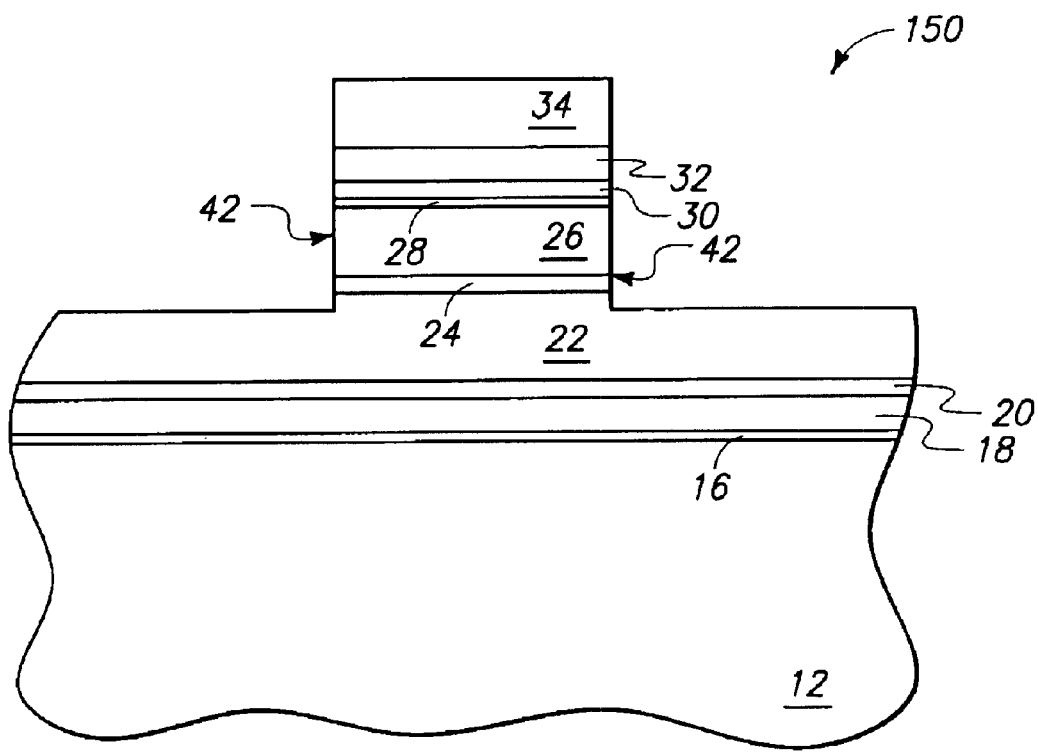
FIG. 5 is a view of the FIG. 4 wafer fragment shown at a processing stage subsequent to that of FIG. 4.

Referring to FIG. 5, a pattern from mask 152 (FIG. 4) is transferred to layers 24, 26, 28, 30, 32 and 34 with a suitable etch. The pattern is also transferred partway into silicon-containing layer 22. Subsequently, mask 152 (FIG. 4) is removed.

The first gate pattern extending through layers 24, 26, 28, 30, 32 and 34, and into layer 22, comprises sidewalls 42 extending along the etched layers.

Figure 6:
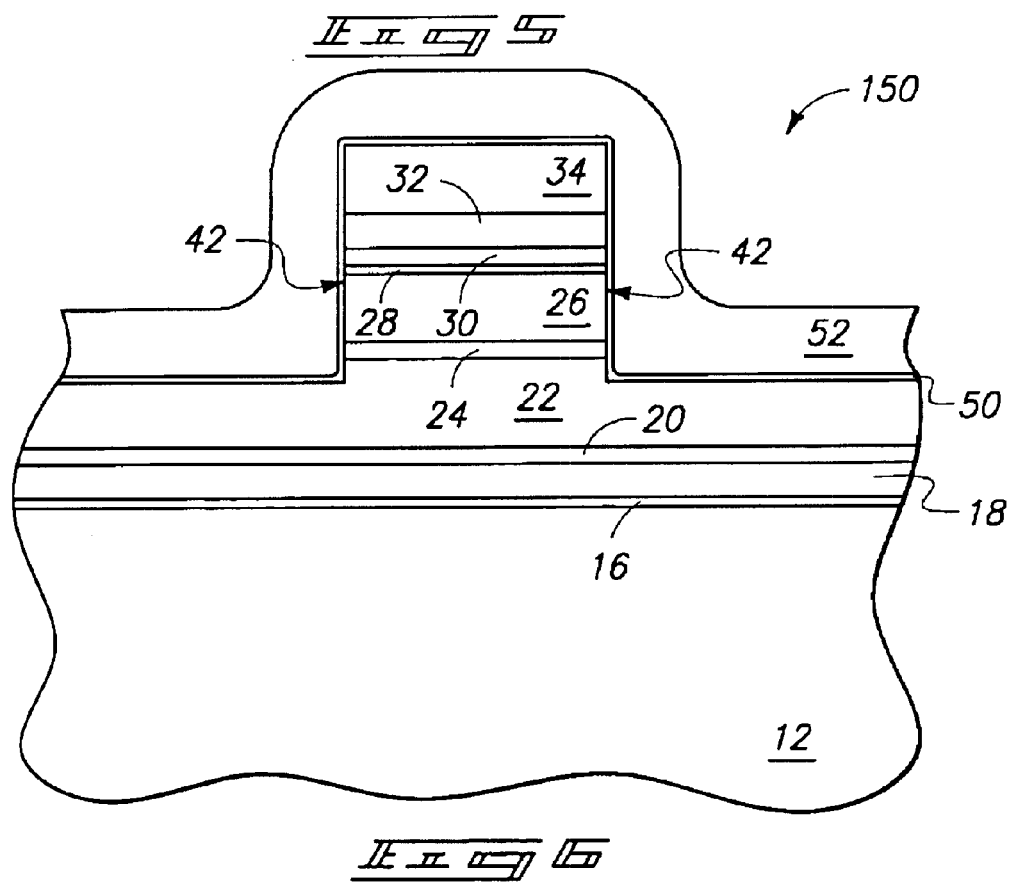
FIG. 6 is a view of the FIG. 4 wafer fragment shown at a processing stage subsequent to that of FIG. 5.

Referring to FIG. 6, a first layer 50 is formed along the sidewalls 42 and over the stack comprising layers 24, 26, 28, 30, 32 and 34. Additionally, a second layer 52 is formed over first layer 50, with the second layer also extending along the sidewalls 42 and over the top of the stack. First layer 50 can comprise, consist essentially of, or consist of one or more nitride compositions, such as silicon nitride or titanium nitride. Second layer 52 can comprise, consist essentially of, or consist of silicon. In particular aspects, the silicon will be non-oxidized, such as, for example, polycrystalline and/or amorphous silicon.

Referring to FIG. 7, layers 50 and 52 are anisotropically etched to form sidewall spacers 46 comprising layers 50 and 52.

Referring to FIG. 8, layers 16, 18, 20 and 22 are etched while sidewall spacers 46 are along sidewalls 42. Etched layers 16, 18 and 20 have a wider lateral width than do layers 24, 26, 28, 30, 32 and 34. Specifically, layers 24, 26, 28, 30, 32 and 34 can be considered to comprise a first lateral width 40, and layers 16, 18 and 20 can be considered to comprise a second lateral width 54 which is about equal to the first lateral width plus a lateral width of sidewalls 46.

Layer 22 has a lower portion having the lateral width 54 and an upper portion having the lateral width 40.

Layers 16, 18, 20, 22, 24, 26, 28, 30, 32 and 34 are together incorporated into a gate stack 156 of a programmable memory device. Gate stack 156 can be considered to comprise a first gate stack pattern corresponding to the layers having lateral width 40, and a second gate stack pattern corresponding to layers having lateral width 54.

After the etching of layers 16, 18, 20 and 22, source/drain regions 56 are implanted into substrate 12. Source/drain regions 56 can correspond to either n-type dope or p-type doped diffusion regions formed within the semiconductive material of substrate 12.

Referring to FIG. 9, a layer 158 is formed over gate stack 156, and a layer 160 is formed over layer 158. Layer 158 can comprise, consist essentially of, or consist of silicon dioxide. Layer 160 can comprise, consist essentially of, or consist of silicon nitride.

Referring to FIG. 10, layers 158 and 160 are anisotropically etched to form sidewall spacers 58. It is noted that various of the processing steps described above can be omitted, or conducted in orders other than those described. For instance, at least a portion of source/drain regions 56 can be implanted after formation of spacers 58.

The construction of FIG. 10 comprises a programmable memory device 14 comparable to that described with reference to FIG. 1.

FIG. 11 illustrates a construction 180 comprising a pair of programmable memory devices 14 at a fabrication stage subsequent to that of FIG. 10. Specifically, a mass 182 of insulative material has been formed over constructions 14. Mass 182 can comprise, consist essentially of, or consist of, for example, borophosphosilicate glass (BPSG). A mask 184 is formed over mass 182. Mask 184 can comprise, for example, photoresist, and can be patterned utilizing photo-lithographic processing. Mask 184 has an opening 186 extending therethrough, and at the shown processing stage the opening from mask 184 has been transferred to mass 182 with a suitable etch. Material 160 of spacers 58 is preferably substantially resistant to the etch of mass 182, and accordingly the opening extending into mass 182 is a self-aligned contact opening relative to constructions 14. In subsequent processing (not shown) a conductive material can be formed within the opening, and in electrical contact with the source/drain region 56 at the bottom of the opening. The constructions 14 of FIG. 11 can be part of a memory array.

FIG. 12 illustrates a top view of a fragment of a semiconductor construction 200 at an intermediate processing stage during fabrication of a memory array comprising programmable memory devices. In referring to fragment 200, similar numbering will be utilized as was used above in describing the structures of FIGS. 1–10, where appropriate. Fragment 200 comprises a substrate 12 having a series of isolation regions 202 formed therein. Isolation regions 202 can comprise, for example, shallow trench isolation regions. Accordingly, regions 202 can comprise an insulative material (such as, for example, silicon dioxide) formed within trenches extending into substrate 12.

A series of gateline stacks 156 extend across substrate 12 and over the isolation regions 202. Stacks 156 can correspond to the stack shown in FIG. 8. Preferably, for reasons discussed below, the stacks will be at the processing stage shown in FIG. 8. It is noted that if the stacks correspond to the processing stage shown in FIG. 8, then the structure of FIG. 8 can be considered to be a construction shown in cross section along the line 8—8 of FIG. 12.

A pair of source access regions 204 are illustrated proximate opposing edges of fragment 200. Source access regions 204 correspond to regions wherein sources of the above-described source/drain regions will be accessed for electrical connection.

In processing subsequent to the stage shown in FIG. 12, source regions accessed through regions 204 can be connected to one another through a so-called source rail. Source rails are commonly utilized in, for example, NOR type flash cells.

Source rail fabrication can comprise removal of insulative material from isolation regions 202 between source access regions 204, and subsequent provision of dopant across substrate 12 between regions 204 to form a conductively-doped expanse of substrate 12 extending between, and electrically connecting, regions 204. Typically, isolation regions 202 will comprise silicon dioxide. A problem that can occur during removal of the silicon dioxide from isolation regions 202 between source access regions 204 is that exposed silicon surfaces of substrate 12 can be etched during the etch utilized to remove the silicon dioxide of isolation regions 202. Accordingly, the exposed silicon surfaces are typically pre-treated to form a polymer which protects the surfaces during removal of oxide from isolation regions 202.

FIG. 13 is a diagrammatic, cross-sectional view along the line 13—13 of FIG. 12 at a processing stage subsequent to that of FIG. 12. Source access regions 204 are shown extending to source diffusion regions 56 extending within substrate 12. Also, a conductively-doped source rail 206 is shown extending across an upper surface of substrate 12 and electrically connecting source regions 56 with one another. Substrate 12 has trenches 208 extending therein. Such trenches correspond to the regions where trenched isolation regions 202 (FIG. 12) extended across substrate 12. At the processing step of FIG. 12, the trenched isolation regions would have had an insulative material (typically silicon dioxide) within trenches 208, and at the processing step of FIG. 13 the silicon dioxide has been removed to allow conductive doping into trenches 208 during formation of source rail 206. As was discussed above, exposed portions of silicon from substrate 12 would typically be protected by polymer during removal of silicon dioxide from within trenches 208. Such polymer is removed prior to the doping to form source rail 206, and accordingly the polymer is not present at the processing stage of FIG. 13.

Figure 14:
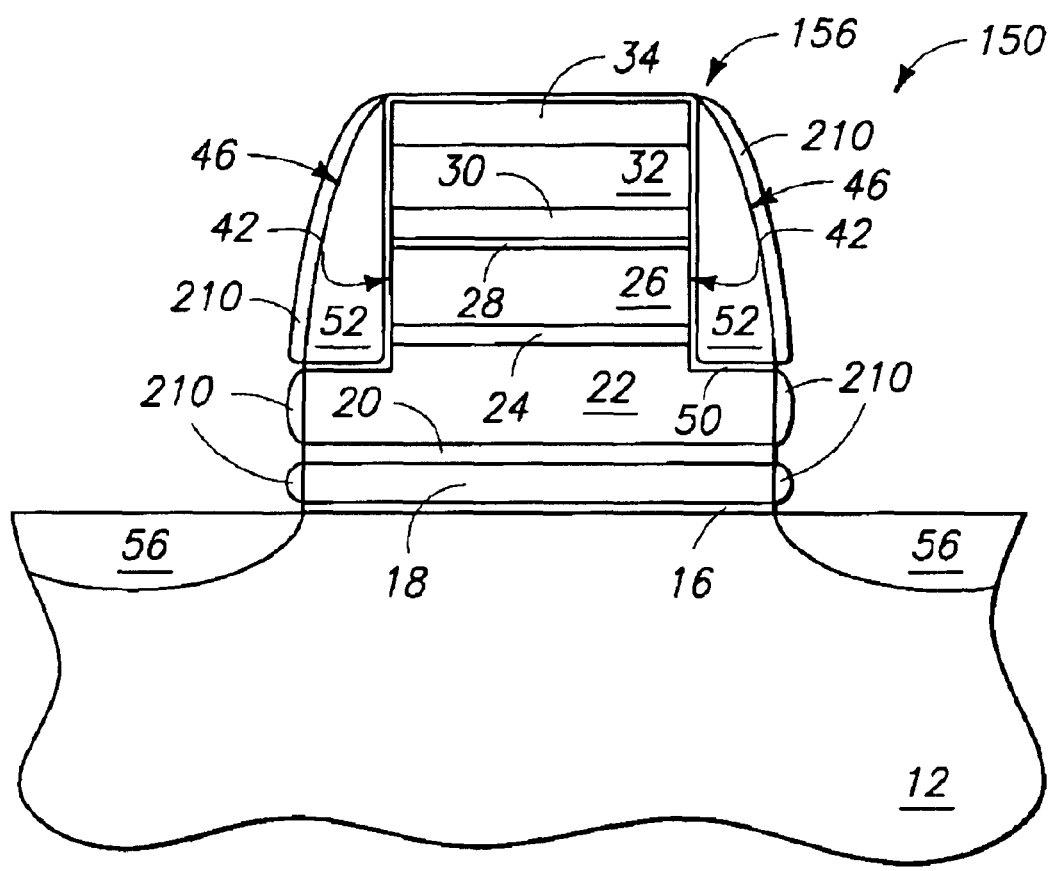
FIG. 14 is a diagrammatic, cross-sectional view of the programmable memory device of FIG. 8 shown at a processing stage subsequent to that of FIG. 8. The processing stage of FIG. 14 can occur simultaneously with formation of a source rail.

FIG. 14 illustrates an advantageous aspect of various constructions of the present invention. Specifically, FIG. 14 illustrates the fragment 150 of FIG. 8 at a processing stage subsequent to that of FIG. 8, and specifically at a processing stage subsequent to formation of polymer over exposed silicon surfaces during source rail fabrication. In various aspects of the invention, materials 18, 22 and 52 can comprise, consist essentially of, or consist of silicon. In such applications, a layer 210 of polymer can form over exposed surfaces of materials 18, 22 and 52 to protect such surfaces during the etch utilized to remove silicon dioxide from isolation regions 202 (FIG. 12). After the etch of the silicon dioxide, polymer 210 can be removed.

In subsequent processing (not shown), non-oxidized silicon of spacers 52 can be oxidized, and then the spacers 58 (FIG. 10) can be formed across sidewalls of gate stack construction 156. Sidewalls of materials 22 and 18 can be protected during oxidation of material 52, or in other processing the sidewalls can be exposed to the oxidation conditions so that a layer of oxide forms along the edges of silicon-containing materials 18 and 22.

The etch utilized for removing silicon dioxide from isolation regions 202 (FIG. 12) can be an aggressive etch, and accordingly can, in particular aspects, proceed through either of layers 32 and 34 that corresponds to either silicon dioxide or silicon oxynitride. However, silicon nitride is frequently relatively resistant to the etch utilized for the silicon dioxide of the isolation regions. Accordingly, if either of layers 32 and 34 comprises silicon nitride, such can be resistant to the etch. Further, if mass 28 comprises silicon nitride (as discussed above with reference to FIG. 3), or if a silicon nitride layer is formed over a titanium nitride containing mass 28 (as discussed above with reference to FIG. 2, with the silicon nitride layer shown as layer 104), the silicon nitride can form a protective layer which is relatively resistant to the etch utilized for removing silicon dioxide of the isolation regions.

It is noted, however, that the aggressive etch utilized to remove silicon dioxide from isolation regions will frequently be capable of etching into nitride (although the etching in the nitride will typically be at a slower rate than the etching into oxide). In applications in which layers 30 comprises non-oxidized silicon, the layer can be exposed prior to formation of polymer 210. Accordingly, the polymer will form over such layer, and can thereby form a protective cap over remaining portions of gate stack 156 during the etching of silicon dioxide from the trench isolation regions.

The embodiments described herein can advantageously surround a mass comprising, consisting essentially of, or consisting of tungsten (such as the mass 26 of FIGS. 1–3) entirely with various nitride compositions. In particular aspects, the nitride compositions comprise one or both of tungsten nitride and silicon nitride. In some embodiments, only tungsten nitride is utilized along sidewalls of the mass containing elemental tungsten, in other embodiments, only silicon nitride is utilized over a top and along sidewalls of the mass containing tungsten, and in yet other embodiments a combination of silicon nitride and tungsten nitride is utilized over a top of the mass containing tungsten and/or along sidewalls of the mass. An advantage to utilizing silicon nitride at least over a top of the mass containing tungsten is that the silicon nitride can form a protective cap which prevents dopant from being implanted into underlying regions of a gate stack during implants utilized to form diffusion regions in a semiconductor substrate supporting the gate stack.

The nitride barrier layers formed around the mass containing tungsten can not only alleviate or prevent diffusion of materials outwardly from the tungsten, but also can alleviate or prevent diffusion of materials to the tungsten which would otherwise contaminate the tungsten. Additionally, the nitride compositions surrounding the tungsten can alleviate or prevent tungsten reaction with other materials. For instance, if tungsten directly contacts a material consisting essentially of, or consisting of, silicon under the right conditions tungsten silicide can result. However, if the silicon is present in a material as silicon nitride, tungsten silicide will generally not form.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A programmable memory device supported by a semiconductor substrate and comprising in ascending order from the substrate:
   a floating gate;
   a dielectric material;
   a layer consisting essentially of $WN_x$;
   a first mass consisting essentially of W; and
   a second mass consisting essentially of $WN_x$.

2. The device of claim 1 wherein the programmable memory device is a flash device.

3. The device of claim 1 wherein the second mass is physically against the first mass.

4. The device of claim 1 wherein the second mass comprises a first layer and a second layer, the first layer consisting essentially of tungsten nitride and a second layer consisting essentially of silicon nitride.

5. The device of claim 4 wherein the second layer is over the first layer.

6. A programmable memory device supported by a semiconductor substrate and comprising:
   a floating gate over the substrate;
   a dielectric material over the floating gate;
   a mass consisting essentially of W over the dielectric material; the mass comprising a pair of opposing sidewalls;
   a pair of sidewall spacers along the opposing sidewalls of the mass; the sidewall spacers comprising a first layer consisting essentially of one or more nitride compounds and a second layer different from the first layer; and
   wherein a first lateral width is defined as a distance between the sidewalls of the mass, a second lateral width is defined as the first lateral width plus lateral widths of the sidewall spacers, and the floating gate has a lateral width about equal to the second lateral width.

7. The device of claim 6 wherein the programmable memory device is a flash device.

8. The device of claim 6 wherein the dielectric material has a lateral width about equal to the second lateral width.

9. The device of claim 6 further comprising a gate oxide layer between the floating gate and the substrate, and wherein the gate oxide layer has a lateral width about equal to the second lateral width.

10. The device of claim 9 wherein the dielectric material has a lateral width about equal to the second lateral width.

11. The device of claim 6 further comprising a silicon-containing layer between the dielectric material and the mass, and wherein:

the dielectric material has a lateral width about equal to the second lateral width;

the silicon-containing layer has a first portion proximate the mass, the first portion having a lateral width about equal to the first lateral width; and the silicon-containing layer has a second portion proximate the dielectric material, the second portion having a lateral width about equal to the second lateral width.

12. The device of claim 11 further comprising a layer consisting essentially of $WN_x$ between the silicon-containing layer and the mass.

13. The device of claim 6 wherein the first layer of the sidewall spacers is physically against the mass.

14. The device of claim 6 wherein the first layer of the sidewall spacers consists essentially of silicon nitride.

15. The device of claim 6 wherein the first layer of the sidewall spacers consists essentially of tungsten nitride.

16. The device of claim 6 wherein the second layer of the sidewall spacers consists essentially of silicon dioxide.

17. The device of claim 6 wherein the second layer of the sidewall spacer consists essentially of silicon.

18. The device of claim 6 wherein the first layer of the sidewall spacers is physically against the mass; and wherein the first layer of the sidewall spacers consists essentially of silicon nitride.

19. The device of claim 6 wherein the first layer of the sidewall spacers is physically against the mass; and wherein the first layer of the sidewall spacers consists essentially of tungsten nitride.

20. The device of claim 6 wherein:

the first layer of the sidewall spacers is physically against the sidewalls of the mass;

the second layer of the sidewall spacers is laterally outward of the first layer and comprises silicon dioxide; and the sidewall spacers comprise a third layer laterally outward of the second layer and comprising silicon nitride.

21. The device of claim 20 wherein the first layer of the sidewall spacers consists essentially of tungsten nitride.

22. The device of claim 20 wherein the first layer of the sidewall spacers consists essentially of silicon nitride.

23. A programmable memory device supported by a semiconductor substrate and comprising:

a floating gate over the substrate;

a dielectric material over the floating gate;

a first layer consisting essentially of WNx over the dielectric material;

a mass consisting essentially of W over the first layer;

a second layer consisting essentially of one or more nitride compounds over the mass;

a third layer consisting essentially of one or more nitride compounds over the second layer, the third layer having a different composition than the second layer; the mass, first layer, second layer, and third layer being comprised by a stack having a pair of opposing sidewalls; and a pair of sidewall spacers along and physically against the opposing sidewalls of the stack; the sidewall spacers comprising a first portion consisting essentially of one or more nitride compounds and a second portion different from the first portion.

24. The device of claim 23 wherein the programmable memory device is a flash device.

25. The device of claim 23 wherein the second layer consists essentially of tungsten nitride and the third layer consists essentially of silicon nitride.

26. The device of claim 23 wherein the second layer is physically against the mass.

27. The device of claim 23 wherein, the second layer consists essentially of silicon nitride.

28. The device of claim 23 wherein the second layer consists essentially of tungsten nitride.

29. The device of claim 23 wherein the first portions of the sidewall spacers are physically against the mass; and wherein the second portions of the sidewall spacers are spaced from the mass by the first portions of the sidewall spacers.

30. The device of claim 23 wherein the first portions of the sidewall spacers consist essentially of silicon nitride.

31. The device of claim 23 wherein the first portions of the sidewall spacers consist essentially of tungsten nitride.

32. The device of claim 23 wherein the second portions of the sidewall spacers consist essentially of silicon dioxide.

33. The device of claim 23 wherein the second portions of the sidewall spacers consist essentially of silicon.

34. The device of claim 23 wherein the first portions of the sidewall spacers are physically against the mass; wherein the second portions of the sidewall spacers are spaced from the mass by the first portions of the sidewall spacers; and wherein the first portions of the sidewall spacers consist essentially of silicon nitride.

35. The device of claim 23 wherein the first portions of the sidewall spacers are physically against the mass; wherein the second portions of the sidewall spacers are spaced from the mass by the first portions of the sidewall spacers; and wherein the first portions of the sidewall spacers consist essentially of tungsten nitride.

36. The device of claim 23 wherein:

a first lateral width is defined as a distance between the sidewalls of the mass a second lateral width is defined as the first lateral width plus lateral widths of the sidewall spacers; and the floating gate has a lateral width about equal to the second lateral width.

37. The device of claim 36 wherein the dielectric material has a lateral width about equal to the second lateral width.

38. The device of claim 23 further comprising a gate oxide layer between the floating gate and the substrate, and wherein:

a first lateral width is defined as a distance between the sidewalls of the mass;

a second lateral width is defined as the first lateral width plus lateral widths of the sidewall spacers; and the gate oxide layer and floating gate have lateral widths about equal to the second lateral width.

39. The device of claim 38 wherein the dielectric material has a lateral width about equal to the second lateral width.

40. The device of claim 23 further comprising a silicon-containing layer between the dielectric material and the first layer, and wherein:

a first lateral width is defined as a distance between the sidewalls of the mass a second lateral width is defined as the first lateral width plus lateral widths of the sidewall spacers;

the floating gate and dielectric material have lateral widths about equal to the second lateral width;

the silicon-containing layer has a first portion proximate the first layer, the first portion having a lateral width about equal to the first lateral width; and the silicon-containing layer has a second portion proximate the dielectric material, the second portion having a lateral width about equal to the second lateral width.

41. A programmable memory device supported by a semiconductor substrate, comprising:

a floating aate over the substrate;

a gate oxide layer between the floating gate and the substrate;

a dielectric material over the floating gate;

a mass consistin essentiall of W over the dielectric material the mass comprising a pair of opposing sidewalls;

a pair of sidewall spacers alona the opposing sidewalls of the mass, the sidewall spacers comprising:
a first layer consisting essentially of $WN_x$; and
a second layer different from the first layer; and wherein:
a first lateral width is defined as a distance between the sidewalls of the mass;
a second lateral width is defined as the first lateral width plus lateral widths of the sidewall spacers; and
the gate oxide layer and floating gate have lateral widths about equal to the second lateral width.

42. The device of claim 41 wherein the dielectric material has a lateral width about equal to the second lateral width.

43. A programmable memory device sUpported by a semiconductor substrate, comprising:

a floating aate over the substrate:
a dielectric material over the floating gate;

a mass consisting essentially of W over the dielectric material, the mass comprising a pair of opposing sidewalls;

a silicon-containing layer between the dielectric material and the mass;

a pair of sidewall spacers along the opposing sidewalls of the mass, the sidewall spacers comDrising:
a first layer consisting essentially of $WN_x$; and
a second layer different from the first layer; and
wherein:
a first lateral width is defined as a distance between the sidewalls of the mass;
a second lateral width is defined as the first lateral width plus lateral widths of the sidewall spacers;
the floating gate and dielectric material have lateral widths about equal to the second lateral width;
the silicon-containing layer has a first portion proximate the mass, the first portion having a lateral width about equal to the first lateral width; and
the silicon-containing layer has a second portion proximate the dielectric material, the second portion having a lateral width about equal to the second lateral width.

44. The device of claim 43 further comprising a layer consisting essentially of $WN_x$ between the silicon-containing layer and the mass.

45. A programmable memory device supported by a semiconductor substrate, comprising:
a floating gate over the substrate;
a dielectric material over the floating gate;
a mass consisting essentially of W over the dielectric material, the mass comprising a pair of opposing sidewalls; and
a pair of sidewall spacers along the opposing sidewalls of the mass, the sidewall spacers comprising a first layer consisting essentially of one or more nitride compounds and a second layer different from the first layer, wherein:
the second layer consists essentially of silicon;
a first lateral width is defined as a distance between the sidewalls of the mass; and
a second lateral width is defined as the first lateral width plus lateral widths of the sidewall spacers, the floating gate having a lateral width about equal to the second lateral width, wherein the dielectric material has a lateral width about equal to the second lateral width.

46. A programmable memory device supported by a semiconductor substrate, comprising:
a floating gate over the substrate;
a dielectric material over the floating gate;
a mass consisting essentially of W over the dielectric material, the mass comprising a pair of opposing sidewalls; and
a pair of sidewall spacers along the oDDosing sidewalls of the mass, the sidewall spacers comprising a first layer consisting essentially of one or more nitride compounds and a second layer different from the first layer, wherein:
the second layer consists essentially of silicon;
a first lateral width is defined as a distance between the sidewalls of the mass;
a second lateral width is defined as the first lateral width plus lateral widths of the sidewall spacers; and
the gate oxide layer and floating gate have lateral widths about equal to the second lateral width.

47. The device of claim 46 wherein the dielectric material has a lateral width about equal to the second lateral width.

48. A programmable memory device supported by a semiconductor substrate, comprising:
a floating gate over the substrate;
a dielectric material over the floating gate;
a mass consisting essentially of W over the dielectric material, the mass comprising a pair of opposing sidewalls; and
a pair of sidewall spacers along the opposing sidewalls of the mass, the sidewall spacers comprising a first aver consisting essentially of one or more nitride compounds and a second layer different from the first layer, wherein:
the second layer consists essentially of silicon;
a first lateral width is defined as a distance between the sidewalls of the mass;
a second lateral width is defined as the first lateral width plus lateral widths of the sidewall spacers;
the floating gate and dielectric material have lateral widths about equal to the second lateral width;
the silicon-containing layer has a first portion proximate the mass, the first portion having a lateral width about equal to the first lateral width; and
the silicon-containing layer has a second portion proximate the dielectric material, the second portion having a lateral width about equal to the second lateral width.

49. The device of claim 48 further comprising a layer consisting essentially of $WN_x$ between the silicon-containing layer and the mass.

50. A programmable memory device supported by a semiconductor substrate and comprising:
  a floating gate over the substrate;
  a dielectric material over the floating gate;
  a first layer consisting essentially of $WN_x$ over the dielectric material;
  a mass consisting essentially of W over the first layer;
  a second layer over the mass, the second layer consisting essentially of $WN_x$; the mass, first layer and second layer being comprised by a stack having a pair of opposing sidewalls; and
  a pair of sidewall spacers along and physically against the opposing sidewalls of the stack; the sidewall spacers comprising a first portion consisting essentially of one or more nitride compounds and a second portion different from the first portion.

51. The device of claim 50 wherein the programmable memory device is a flash device.

52. The device of claim 50 further comprising:
  a third layer consisting essentially of silicon nitride over the second layer;
  the third layer having a different composition than the second layer;
  the stack comprising the third layer;
  the third layer having edges along the sidewalls of the stack; and
  the pair of sidewall spacers extending along the edges of the third layer.

53. The device of claim 50 wherein the second layer is physically against the mass.

54. The device of claim 50 wherein the first portions of the sidewall spacers are physically against the mass; and wherein the second portions of the sidewall spacers are spaced from the mass by the first portions of the sidewall spacers.

55. The device of claim 50 wherein the first portions of the sidewall spacers consist essentially of silicon nitride.

56. The device of claim 50 wherein the first portions of the sidewall spacers consist essentially of tungsten nitride.

57. The device of claim 50 wherein the second portions of the sidewall spacers consist essentially of silicon dioxide.

58. The device of claim 50 wherein the second portions of the sidewall spacers consist essentially of silicon.

59. The device of claim 50 wherein the first portions of the sidewall spacers are physically against the mass; wherein the second portions of the sidewall spacers are spaced from the mass by the first portions of the sidewall spacers; and wherein the first portions of the sidewall spacers consist essentially of silicon nitride.

60. The device of claim 50 wherein the first portions of the sidewall spacers are physically against the mass; wherein the second portions of the sidewall spacers are spaced from the mass by the first portions of the sidewall spacers; and wherein the first portions of the sidewall spacers consist essentially of tungsten nitride.

61. The device of claim 50 wherein:
  a first lateral width is defined as a distance between the sidewalls of the mass;
  a second lateral width is defined as the first lateral width plus lateral widths of the sidewall spacers; and
  the floating gate has a lateral width about equal to the second lateral width.

62. The device of claim 50 wherein the dielectric material has a lateral width about equal to the second lateral width.

63. The device of claim 50 further comprising a gate oxide layer between the floating gate and the substrate, and wherein:
  a first lateral width is defined as a distance between the sidewalls of the mass;
  a second lateral width is defined as the first lateral width plus lateral widths of the sidewall spacers; and
  the gate oxide layer and floating gate have lateral widths about equal to the second lateral width.

64. The device of claim 63 wherein the dielectric material has a lateral width about equal to the second lateral width.

65. The device of claim 50, further comprising a silicon-containing layer between the dielectric material and the first layer, and wherein:
  a first lateral width is defined as a distance between the sidewalls of the mass;
  a second lateral width is defined as the first lateral width plus lateral widths of the sidewall spacers;
  the floating gate and dielectric material have lateral widths about equal to the second lateral width;
  the silicon-containing layer has a first portion proximate the first layer, the first portion having a lateral width about equal to the first lateral width; and
  the silicon-containing layer has a second portion proximate the dielectric material, the second portion having a lateral width about equal to the second lateral width.

66. A programmable memory device supported by a semiconductor substrate, comprising:
  a floating gate over the substrate;
  a dielectric material over the floating gate;
  a first layer consisting essentially of $WN_x$ over the dielectric material;
  a mass consisting essentially of W over the first layer;
  a second layer consisting essentially of one or more nitride compounds over the mass;
  a third layer consisting essentially of silicon nitride over the second layer, the third layer having a different composition than the second layer; and the mass, first, second and third layers being comprised by a stack having a pair of opposing sidewalls, wherein the third layer comprises edges along the sidewalls of the stack; and
  a pair of sidewall spacers along and physically against the opposing sidewalls of the stack, the sidewall spacers comprising a first portion and a second portion different from the first portion, wherein the first portion consists essentially of $WN_x$ and the pair of sidewall spacers extend along the edges of the third layer.

67. A programmable memory device supported by a semiconductor substrate, comprising:
  a floating gate over the substrate;
  a dielectric material over the floating gate;
  a first layer consisting essentially of $WN_x$ over the dielectric material;
  a mass consisting essentially of W over the first layer;
  a second layer consisting essentially of one or more nitride compounds over the mass; the mass, first layer and second layer being comprised by a stack having a pair of opposing sidewalls; and
  a pair of sidewall soacers along and physically against the opposing sidewalls of the stack, the sidewall spacers comprising a first portion and a second portion different from the first portion, wherein the first portion consists essentially of $WN_x$, wherein:

a first lateral width is defined as a distance between the sidewalls of the mass;
a second lateral width is defined as the first lateral width plus lateral widths of the sidewall spacers; and
the floating gate has a lateral width about equal to the second lateral width.

68. The device of claim 67 wherein the dielectric material has a lateral width about equal to the second lateral width.

69. A procirammable memory device supported by a semiconductor substrate, comprising:
a floating gate over the substrate;
a gate oxide layer between the floating gate the substrate;
a dielectric material over the floating gate;
a first layer consisting essentially of $WN_x$ over the dielectric material;
a mass consisting essentially of W over the first layer;
a second aver consisting essentially of one or more nitride compounds over the mass; the mass, first layer and second layer being comprised by a stack havina a pair of opposing sidewalls; and
a pair of sidewall spacers along and physically against the opposing sidewalls of the stack, the sidewall seacers comprising a first portion and a second portion different from the first portion, wherein the first portion consists essentially of $WN_x$ wherein:
a first lateral width is defined as a distance between the sidewalls of the mass;
a second lateral width is defined as the first lateral width plus lateral widths of the sidewall spacers; and
the gate oxide layer and floating gate have lateral widths about equal to the second lateral width.

70. The device of claim 69, wherein the dielectric material has a lateral width about equal to the second lateral width.

71. A programmable memory device suoDorted by a semiconductor substrate, comprising:
a floating gate over the substrate;
a dielectric material over the floating gate;
a first layer consisting essentially of $WN_x$ over the dielectric material;
a silicon-containing layer between the dielectric material and the first layer;
a mass consisting essentially of W over the first layer;
a second layer consisting essentially of one or more nitride compounds over the mass; the mass, first layer and second layer being comDrised by a stack having a pair of opposing sidewalls; and
a pair of sidewall soacers alona and ohysically against the opposing sidewalls of the stack, the sidewall soacers comorisina a first oortion and a second portion different from the first portion, wherein the first portion consists essentially of $WN_x$ wherein:
a first lateral width is defined as a distance between the sidewalls of the mass;
a second lateral width is defined as the first lateral width plus lateral widths of the sidewall spacers;
the floating gate and dielectric material have lateral widths about equal to the second lateral width;
the silicon-containing layer has a first portion proximate the first layer, the first portion having a lateral width about equal to the first lateral width; and
the silicon-containing layer has a second portion proximate the dielectric material, the second portion having a lateral width about equal to the second lateral width.

72. A programmable memory device supported by a semiconductor substrate, comprising:
a floating gate over the substrate;
a dielectric material over the floating gate;
a first layer consisting essentially of WNh over the dielectric material;
a mass consisting essentially of W over the first layer;
a second layer consisting essentially of one or more nitride compounds over the mass;
a third layer consisting essentially of silicon nitride over the second layer, the third layer having a different composition than the second layer; and the mass, first, second and third layers being comprised by a stack having a pair of opposing sidewalls, wherein the third layer having comprises edges along the sidewalls of the stack; and
a pair of sidewall spacers alona and physically against the opposing sidewalls of the stack, the sidewall spacers comprising a first portion consisting essentially of one or more nitride compounds and a second portion different from the first portion, wherein the second portion consists essentially of silicon and the pair of sidewall spacers extend along the edges of the third layer.

73. A programmable memory device supported by a semiconductor substrate, comprising:
a floating gate over the substrate;
a dielectric material over the floating gate;
a first layer consisting essentially of $WN_x$ over the dielectric material;
a mass consisting essentially of W over the first layer;
a second layer consisting essentially of one or more nitride compounds over the mass; the mass, first layer and second layer being comprised by a stack having a pair of opposing sidewalls; and
a pair of sidewall spacers along and physically against the opposing sidewalls of the stack, the sidewall spacers comprising a first portion consisting essentially of one or more nitride comnounds and a second portion different from the first portion, wherein:
the second portion consists essentially of silicon;
a first lateral width is defined as a distance between the sidewalls of the mass;
a second lateral width is defined as the first lateral width plus lateral widths of the sidewall spacers: and
the floating gate has a lateral width about equal to the second lateral width.

74. The device of claim 73 wherein the dielectric material has a lateral width about equal to the second lateral width.

75. A programmable memory device supported by a semiconductor substrate and comprising:
a floating gate over the substrate;
a gate oxide layer between the floating gate and the substrate;
a dielectric material over the floating gate;
a first layer consisting essentially of $WN_x$ over the dielectric material;
a mass consisting essentially of W over the first layer;
a second layer consisting essentially of one or more nitride compounds over the mass; the mass, first layer and second layer being comprised by a stack having a pair of opposing sidewalls; and
a pair of sidewall spacers along and physically against the opposing sidewalls of the stack, the sidewall spacers comDrjsing a first portion consisting essentially of one or more nitride compounds and a second portion different from the first portion, wherein:

the second portion consists essentially of silicon;

a first lateral width is defined as a distance between the sidewalls of the mass;

a second lateral width is defined as the first lateral width plus lateral widths of the sidewall spacers; and the gate oxide layer and floating gate have lateral widths about equal to the second lateral width.

76. The device of claim 75 wherein the dielectric material has a lateral width about equal to the second lateral width.

77. A programmable memory device supported by a semiconductor substrate and comprising:

a floating gate over the substrate;

a gate oxide layer between the floating gate and the substrate;

a dielectric material over the floating gate;

a first layer consisting essentially of $WN_x$ over the dielectric material;

a mass consisting essentially of W over the first layer;

a second layer consisting essentially of one or more nitride compounds over the mass; the mass, first layer and second layer being comprised by a stack having a pair of opposing sidewalls; and a pair of sidewall spacers along and physically against the opposing sidewalls of the stack, the sidewall spacers comprising a first portion consisting essentially of one or more nitride comoounds and a second portion different from the first portion, wherein:

the second portion consists essentially of silicon;

a first lateral width is defined as a distance between the sidewalls of the mass;

a second lateral width is defined as the first lateral width plus lateral widths of the sidewall spacers;

the floating gate and dielectric material have lateral widths about equal to the second lateral width;

the silicon-containing layer has a first portion proximate the first layer, the first portion having a lateral width about equal to the first lateral width; and the silicon-containing layer has a second portion proximate the dielectric material, the second portion having a lateral width about equal to the second lateral width.

78. A programmable memory device supported by a semiconductor substrate and comprising:

a floating gate over the substrate;

a dielectric material over the floating gate;

a first layer consisting essentially of $WN_x$ over the dielectric material;

a mass consisting essentially of W over the first layer;

a second layer consisting essentially of one or more nitride compounds over the mass; the mass, first layer and second layer being comprised by a stack having a pair of opposing sidewalls;

a pair of sidewall spacers along and physically against the opposing sidewalls of the stack; the sidewall spacers comprising a first portion consisting of one or more nitride compounds and a second portion different from the first portion; and wherein, a first lateral width is defined as a distance between the sidewalls of the mass, a second lateral width is defined as the first lateral width plus lateral widths of the sidewall spacers, and the floating gate has a lateral width about equal to the second lateral width.

79. The device of claim 78 wherein the programmable memory device is a flash device.

80. The device of claim 78 further comprising:

a third layer consisting essentially of silicon nitride over the second layer;

the third layer having a different composition than the second layer;

the stack comprising the third layer;

the third layer having edges along the sidewalls of the stack; and the pair of sidewall spacers extending along the edges of the third layer.

81. The device of claim 78 wherein the second layer is physically against the mass.

82. The device of claim 78 wherein the second layer consists essentially of silicon nitride.

83. The device of claim 78 wherein the first portions of the sidewall spacers are physically against the mass; and wherein the second portions of the sidewall spacers are spaced from the mass by the first portions of the sidewall spacers.

84. The device of claim 78 wherein the first portions of the sidewall spacers consist essentially of silicon nitride.

85. The device of claim 78 wherein the second portions of the sidewall spacers consist essentially of silicon dioxide.

86. The device of claim 78 wherein the first portions of the sidewall spacers are physically against the mass; wherein the second portions of the sidewall spacers are spaced from the mass by the first portions of the sidewall spacers; and wherein the first portions of the sidewall spacers consist essentially of silicon nitride.

87. The device of claim 78 wherein the first portions of the sidewall spacers are physically against the mass; wherein the second portions of the sidewall spacers are spaced from the mass by the first portions of the sidewall spacers; and wherein the first portions of the sidewall spacers consist essentially of tungsten nitride.

88. The device of claim 78 wherein the dielectric material has a lateral width about equal to the second lateral width.

89. The device of claim 78 further comprising a gate oxide layer between the floating gate and the substrate, wherein the gate oxide layer has a lateral width about equal to the second lateral width.

90. The device of claim 89 wherein the dielectric material has a lateral width about equal to the second lateral width.

91. The device of claim 78 further comprising a silicon-containing layer between the dielectric material and the first layer, and wherein:

the dielectric material has a lateral width about equal to the second lateral width;

the silicon-containing layer has a first portion proximate the first layer, the first portion having a lateral width about equal to the first lateral width; and the silicon-containing layer has a second portion proximate the dielectric material, the second portion having a lateral width about equal to the second lateral width.

92. A programmable memory device supported by a semiconductor substrate and comprising:

a floating gate over the substrate;

a gate oxide layer between the floating gate and the substrate;

a dielectric material over the floating gate;

a first layer consisting essentially of $WN_x$ over the dielectric material;

a mass consisting essentially of W over the first layer;

a second layer consisting essentially of one or more nitride compounds over the mass; the mass, first layer and second layer being comprised by a stack having a pair of opposing sidewalls;

a pair of sidewall spacers along and physically against the opposing sidewalls of the stack; the sidewall spacers comprising a first portion consisting of one or more nitride compounds and a second portion different from the first portion; and wherein, a first lateral width is defined as a distance between the sidewalls of the mass, a second lateral width is defined as the first lateral width plus lateral widths of the sidewall spacers, and the gate oxide layer and floating gate have lateral widths about equal to the second lateral width.

93. The device of claim 92 wherein the programmable memory device is a flash device.

94. The device of claim 92 further comprising:
a third layer consisting essentially of silicon nitride over the second layer;
the third layer having a different composition than the second layer;
the stack comprising the third layer;
the third layer having edges along the sidewalls of the stack; and
the pair of sidewall spacers extending along the edges of the third layer.

95. The device of claim 92 wherein the second layer is physically against the mass.

96. The device of claim 92 wherein the second layer consists essentially of silicon nitride.

97. The device of claim 92 wherein the first portions of the sidewall spacers are physically against the mass; and wherein the second portions of the sidewall spacers are spaced from the mass by the first portions of the sidewall spacers.

98. The device of claim 92 wherein the first portions of the sidewall spacers consist essentially of silicon nitride.

99. The device of claim 92 wherein the second portions of the sidewall spacers consist essentially of silicon dioxide.

100. The device of claim 92 wherein the first portions of the sidewall spacers are physically against the mass; wherein the second portions of the sidewall spacers are spaced from the mass by the first portions of the sidewall spacers; and wherein the first portions of the sidewall spacers consist essentially of silicon nitride.

101. The device of claim 92 wherein the first portions of the sidewall spacers are physically against the mass; wherein the second portions of the sidewall spacers are spaced from the mass by the first portions of the sidewall spacers; and wherein the first portions of the sidewall spacers consist essentially of tungsten nitride.

102. The device of claim 92 wherein the dielectric material has a lateral width about equal to the second lateral width.

103. The device of claim 92 further comprising a silicon-containing layer between the dielectric material and the first layer, and wherein:
the dielectric material has a lateral width about equal to the second lateral width;
the silicon-containing layer has a first portion proximate the first layer, the first portion having a lateral width about equal to the first lateral width; and
the silicon-containing layer has a second portion proximate the dielectric material, the second portion having a lateral width about equal to the second lateral width.

104. A programmable memory device supported by a semiconductor substrate and comprising:
a floating gate over the substrate;
a dielectric material over the floating gate;
a first layer consisting essentially of $WN_x$ over the dielectric material;
a silicon-containing layer between the dielectric material and the first layer;
a mass consisting essentially of W over the first layer;
a second layer consisting essentially of one or more nitride compounds over the mass; the mass, first layer and second layer being comprised by a stack having a pair of opposing sidewalls;
a pair of sidewall spacers along and physically against the opposing sidewalls of the stack; the sidewall spacers comprising a first portion consisting of one or more nitride compounds and a second portion different from the first portion;
a first lateral width is defined as a distance between the sidewalls of the mass
a second lateral width is defined as the first lateral width plus lateral widths of the sidewall spacers;
the floating gate and dielectric material have lateral widths about equal to the second lateral width;
the silicon-containing layer has a first portion proximate the first layer, the first portion having a lateral width about equal to the first lateral width; and
the silicon-containing layer has a second portion proximate the dielectric material, the second portion having a lateral width about equal to the second lateral width.

105. The device of claim 104 wherein the programmable memory device is a flash device.

106. The device of claim 104 further comprising:
a third layer consisting essentially of silicon nitride over the second layer;
the third layer having a different composition than the second layer;
the stack comprising the third layer;
the third layer having edges along the sidewalls of the stack; and
the pair of sidewall spacers extending along the edges of the third layer.

107. The device of claim 104 wherein the second layer is physically against the mass.

108. The device of claim 104 wherein the second layer consists essentially of silicon nitride.

109. The device of claim 104 wherein the first portions of the sidewall spacers are physically against the mass; and wherein the second portions of the sidewall spacers are spaced from the mass by the first portions of the sidewall spacers.

110. The device of claim 104 wherein the first portions of the sidewall spacers consist essentially of silicon nitride.

111. The device of claim 104 wherein the second portions of the sidewall spacers consist essentially of silicon dioxide.

112. The device of claim 104 wherein the first portions of the sidewall spacers are physically against the mass; wherein the second portions of the sidewall spacers are spaced from the mass by the first portions of the sidewall spacers; and wherein the first portions of the sidewall spacers consist essentially of silicon nitride.

113. The device of claim 104 wherein the first portions of the sidewall spacers are physically against the mass; wherein the second portions of the sidewall spacers are spaced from the mass by the first portions of the sidewall spacers; and wherein the first portions of the sidewall spacers consist essentially of tungsten nitride.

114. The device of claim 104 wherein the dielectric material has a lateral width about equal to the second lateral width.

* * * * *

UNITED STATES PATENT AND TRADEMARK OFFICE
CERTIFICATE OF CORRECTION

PATENT NO. : 6,803,624 B2
DATED : October 12, 2004
INVENTOR(S) : Rudeck et al.

It is certified that error appears in the above-identified patent and that said Letters Patent is hereby corrected as shown below:

Column 10,
Line 65, please delete "dilance" after "as a" and insert -- distance --.

Column 13,
Line 16, please delete "aate" after "floating" and insert -- gate --.
Line 21, please delete "consistin essentiall" after "a mass" and insert -- consisting essentially --.
Line 24, please delete "alona" after "spacers" and insert -- along --.
Line 37, please delete "sUpported" after "device" and insert -- supported --.
Line 39, please delete "aate" after "floating" and insert -- gate --.
Line 48, please delete "comDrising" after "spacers" and insert -- comprising --.

Column 14,
Line 29, please delete "oDDosing" after "the" and insert -- opposing --.
Line 51, please delete "aver" after "first" and insert -- layer --.

Column 16,
Line 63, please delete "soacers" after "sidewall" and insert -- spacers --.

Column 17,
Line 9, please delete "procirammable" after "A" and insert -- programmable --.
Line 18, please delete "aver" after "second" and insert -- layer --.
Line 21, please delete "havina" after "stack" and insert -- having --.
Line 24, please delete "seacers" after "sidewall" and insert -- spacers --.
Line 36, please delete "suoDorted" after "device" and insert -- supported --.
Line 48, please delete "comDrised" after "being" and insert -- comprised --.
Line 50, please delete "soacers alona and ophysically" after "sidewall" and insert -- spacers along and physically --.
Line 51, please delete "soacers" after "sidewall" and insert -- spacers --.
Line 52, please delete "comorisina a first oortion" before "and a" and insert -- comprising a first portion --.

Column 18,
Line 5, please delete "WNh" after "essentially of" and insert -- $WN_x$ --.
Line 15, please delete "having" after "layer".
Line 17, please delete "alona" after "spacers" and insert -- along --.
Line 38, please delete "comnounds" after "nitride" and insert -- compounds --.
Line 65, please delete "comDrjsing" before "a first" and insert -- comprising --.

UNITED STATES PATENT AND TRADEMARK OFFICE
CERTIFICATE OF CORRECTION

PATENT NO. : 6,803,624 B2
DATED : October 12, 2004
INVENTOR(S) : Rudeck et al.

It is certified that error appears in the above-identified patent and that said Letters Patent is hereby corrected as shown below:

Column 19,
Line 28, please delete "comnoounds" after "nitride" and insert -- compounds --.

Signed and Sealed this

Fifteenth Day of February, 2005

JON W. DUDAS
*Director of the United States Patent and Trademark Office*